United States Patent
Shiroishi et al.

(10) Patent No.: US 9,552,021 B2
(45) Date of Patent: Jan. 24, 2017

(54) ELECTRONIC DEVICE

(71) Applicant: KABUSHIKI KAISHA TOSHIBA, Minato-ku, Tokyo (JP)

(72) Inventors: Toshikazu Shiroishi, Tokyo (JP); Toshikatsu Nakamura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 30 days.

(21) Appl. No.: 14/617,670

(22) Filed: Feb. 9, 2015

(65) Prior Publication Data
US 2015/0153788 A1    Jun. 4, 2015

Related U.S. Application Data

(63) Continuation of application No. PCT/JP2013/055530, filed on Feb. 28, 2013.

(51) Int. Cl.
| | | |
|---|---|---|
| *G06F 1/16* | (2006.01) | |
| *H05K 5/00* | (2006.01) | |
| *H05K 5/02* | (2006.01) | |
| *H02G 11/00* | (2006.01) | |

(52) U.S. Cl.
CPC ........... *G06F 1/1681* (2013.01); *G06F 1/1683* (2013.01); *H02G 11/00* (2013.01); *H05K 5/0004* (2013.01); *H05K 5/0226* (2013.01); *H05K 5/0247* (2013.01)

(58) Field of Classification Search
CPC .............................. G06F 1/1681; G06F 1/1683
USPC .................. 361/679.27; 174/74 A, 108, 375
See application file for complete search history.

(56) References Cited

U.S. PATENT DOCUMENTS

| | | | | |
|---|---|---|---|---|
| 7,142,898 B2 * | 11/2006 | Takagi | .................... | H04M 1/18 361/679.4 |
| 2006/0178118 A1 * | 8/2006 | Yoshida | .............. | E05D 11/0081 455/90.3 |
| 2006/0254799 A1 * | 11/2006 | Gregorek | ................. | H01R 4/70 174/74 A |
| 2012/0048597 A1 * | 3/2012 | Lin | ...................... | H02G 3/0481 174/254 |

FOREIGN PATENT DOCUMENTS

| | | |
|---|---|---|
| JP | 10-322858 | 12/1998 |
| JP | 2004-232782 | 8/2004 |
| JP | 2005-65354 | 3/2005 |
| JP | 2007-027050 | 2/2007 |
| JP | 2008-32092 | 2/2008 |
| JP | 2008-171592 | 7/2008 |
| JP | 2008-282745 | 11/2008 |

OTHER PUBLICATIONS

International Preliminary Report and Written Opinion for International Application No. PCT/JP2013/055530, mailed Sep. 11, 2015, in 10 pages.
International Search Report for application No. PCT/JP2013/055530, mailed on May 14, 2013.

* cited by examiner

*Primary Examiner* — Tuan T Dinh
*Assistant Examiner* — Mukund G Patel
(74) *Attorney, Agent, or Firm* — Knobbe, Martens, Olson & Bear LLP

(57) ABSTRACT

According to one embodiment, an electronic device includes a first housing, a second housing, a hinge configured to connect the first housing and the second housing and including a pipe, and a cable. The cable includes a first portion outside the pipe and a second portion inside the pipe, thicker than the first portion and in contact with an inner surface of the pipe.

10 Claims, 6 Drawing Sheets

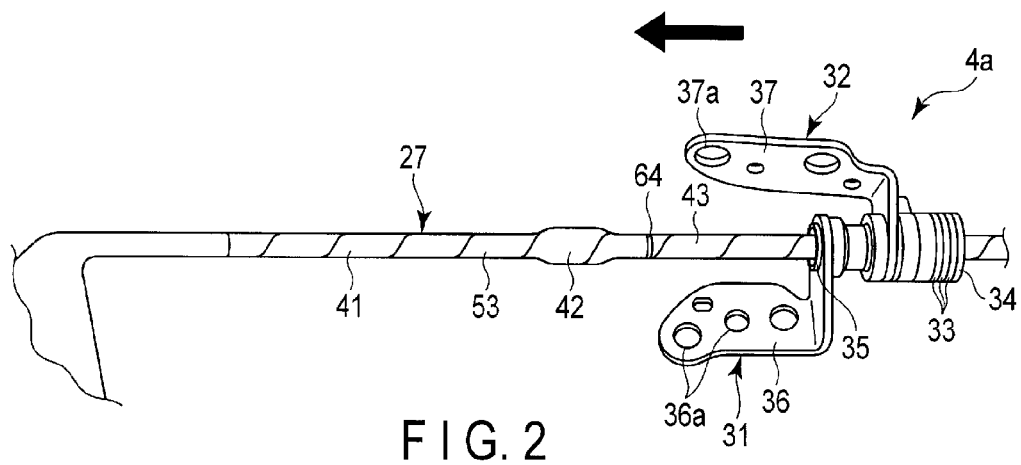
F I G. 2
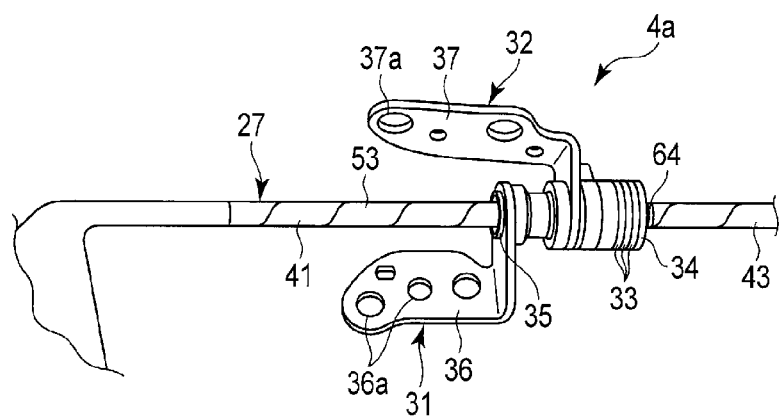
F I G. 3

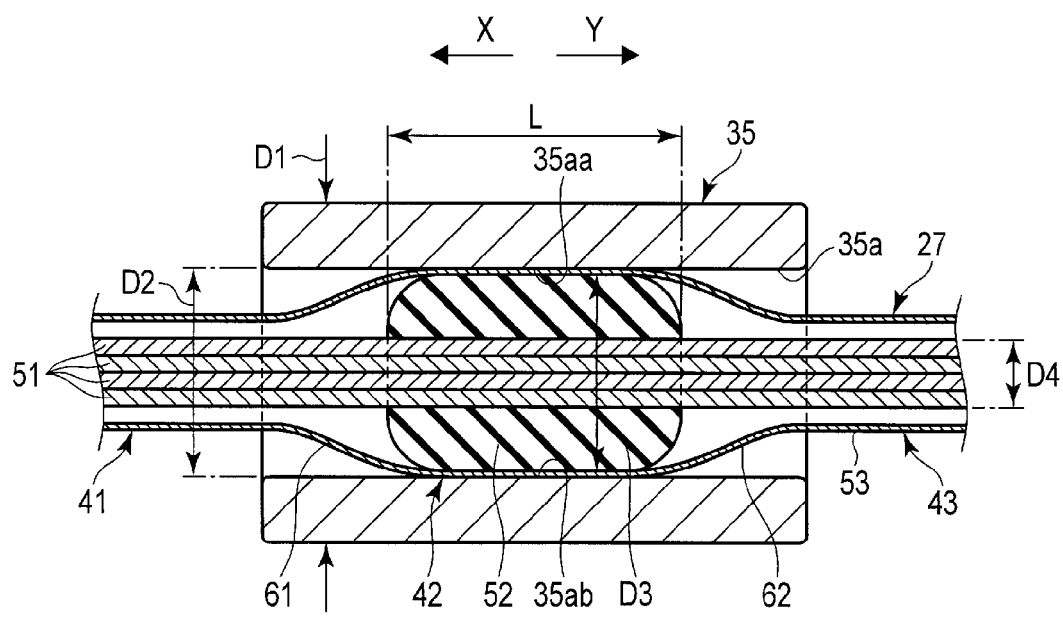
F I G. 5

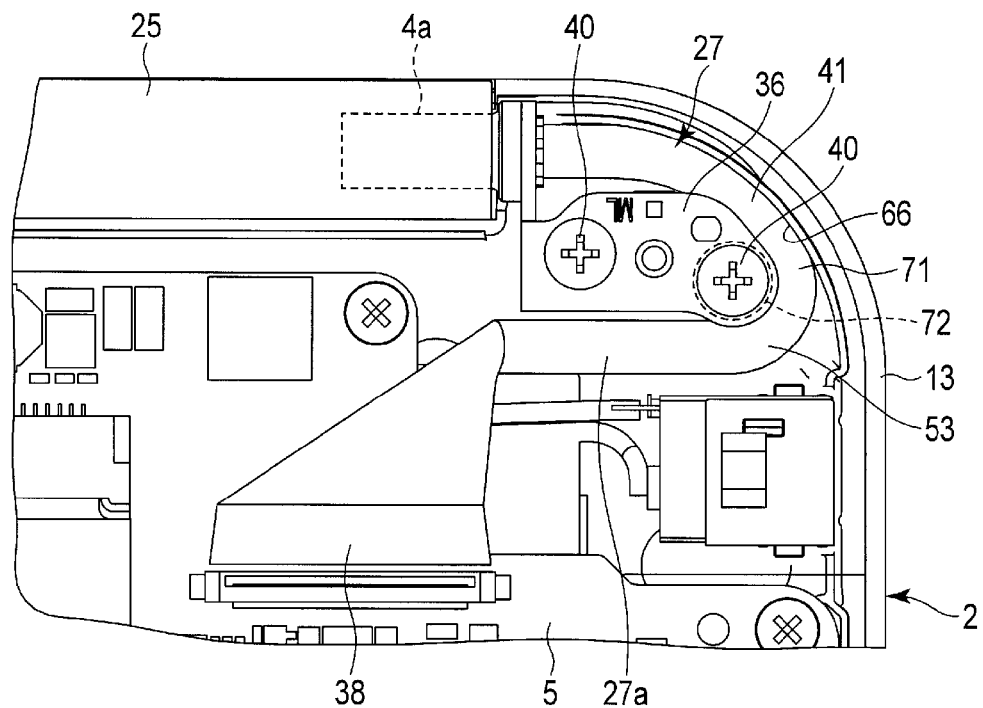
F I G. 7
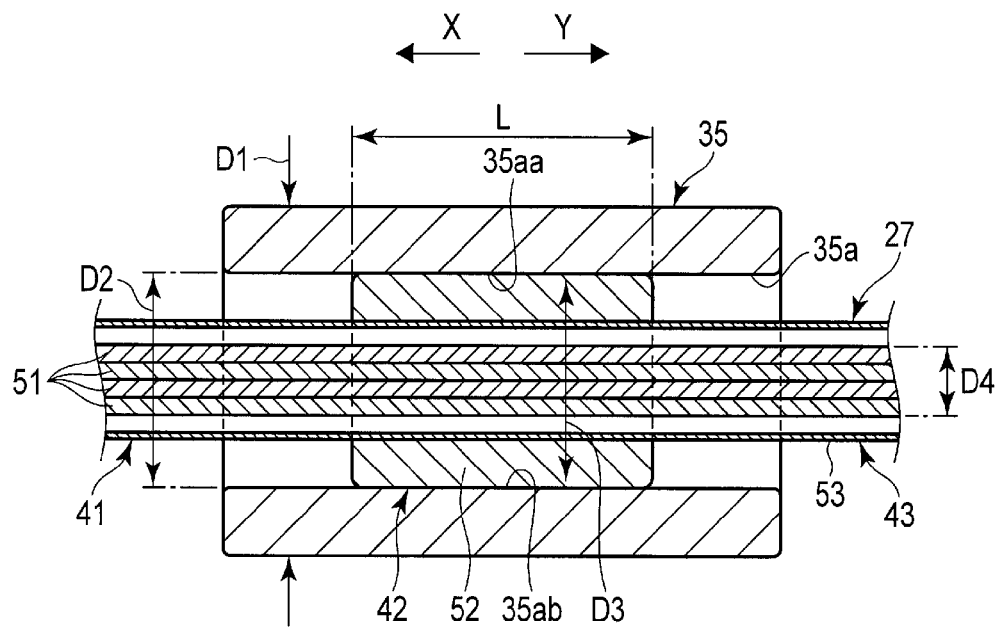
F I G. 8

ELECTRONIC DEVICE

CROSS-REFERENCE TO RELATED APPLICATIONS

This application is a Continuation Application of PCT Application No. PCT/JP2013/055530, filed Feb. 28, 2013, the entire contents of which are incorporated herein by reference.

FIELD

Embodiments described herein relate generally to an electronic device.

BACKGROUND

An electrical wiring assembly including a cable passed through a grommet is provided.

The ease of assembly of electronic devices is required to be improved. One of objects of the embodiment is to provide an electronic device enabling improvement of the ease of assembly.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 2 is a perspective view of a hinge and a cable shown in FIG. 1.

FIG. 3 is a perspective view of the hinge and the cable shown in FIG. 1.

FIG. 5 is a cross-sectional view of the hinge and the cable shown in FIG. 3.

FIG. 7 is an enlarged view of a portion encircled by line F7 in the electronic device shown in FIG. 6.

FIG. 8 is a cross-sectional view of a hinge and a cable of a second embodiment.

DETAILED DESCRIPTION

Various embodiments will be described hereinafter with reference to the accompanying drawings.

In general, according to one embodiment, an electronic device includes a first housing, a second housing, a hinge and a cable. The hinge is configured to connect the first housing and the second housing and includes a pipe having a substantially constant inside diameter. The cable includes a first portion outside the pipe and a second portion inside the pipe, thicker than the first portion and in contact with an inner surface of the pipe.

In the specification, some elements are exemplarily expressed by a plurality of expressions. These expressions are just an example and do not deny that the above elements are expressed by other expressions. Elements which are not expressed by a plurality of expressions may be expressed by other expressions.

First Embodiment

Figure 1:
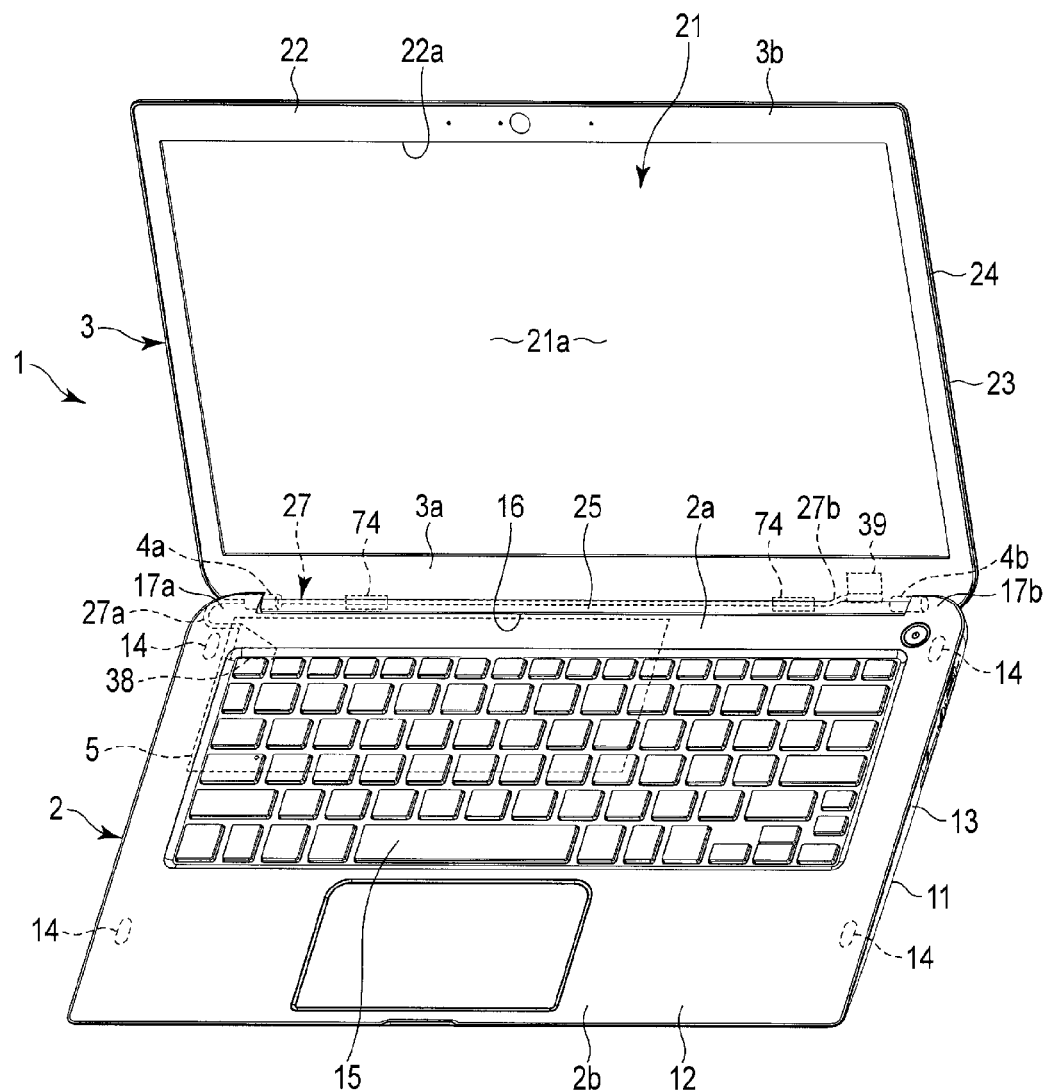
FIG. 1 is a perspective view of an electronic device of a first embodiment.

FIG. 1 to FIG. 7 show an electronic device 1 of a first embodiment. As shown in FIG. 1, the electronic device 1 of the present embodiment is, for example, a notebook portable computer or a notebook PC. The electronic device to which the present embodiment can be applied is not limited to the above example. The present embodiment can be widely applied to various electronic devices such as television receivers; tablet or slate PCs; cellular phones, including smartphones; game consoles, etc.

As shown in FIG. 1, the electronic device 1 includes a first housing 2, a second housing 3 and hinges 4a and 4b. The first housing 2 is, for example, a body housing. The first housing 2 accommodates, for example, a circuit board 5 serving as a main board. The circuit board 5 is an example of a first module. The module accommodated in the first housing 2 is not limited to the circuit board 5, but may be, for example, a wireless unit or other modules.

The first housing 2 includes a lower wall 11 (bottom wall, first wall), an upper wall 12 (second wall) and a peripheral wall 13 (sidewall, third wall), and is formed as a flat box. The lower wall 11 may also be called a bottom wall or a first wall. The upper wall 12 may also be called a second wall. The peripheral wall 13 may also be called a sidewall or a third wall. In the specification, the left, right, top and bottom are defined on the basis of the user's viewpoint. In addition, the position close to the user is defined as the front and the position remote from the user is defined as the back.

When the electronic device 1 is put on a desk, the lower wall 11 faces, for example, an upper surface, a placing surface, an outer surface or an outer placing surface of the desk. The lower wall 11 includes, for example, a plurality of legs 14. The legs 14 may also be called supporting portions. When the electronic device 1 is put on a desk, the legs 14 face an upper surface of the desk and support the electronic device 1.

The upper wall 12 is positioned on the opposite side of the lower wall 11. The upper wall 12 extends, for example, substantially parallel to the lower wall 11. For example, an input module 15 is provided on the upper wall 12. The input module 15 may also be called an input receiver. An example of the input module 15 is a keyboard. The input module 15 is not limited to the keyboard but may be, for example, a touchpanel, a touch sensor or other input devices. The peripheral wall 13 extends in a direction intersecting the upper wall 12 and the lower wall 11, for example, in a direction substantially orthogonal to the upper wall 12 and the lower wall 11, and connects the peripheral edge of the lower wall 11 and the peripheral edge of the upper wall 12.

The first housing 2 includes a first end 2a and a second end 2b. The first end 2a is, for example, a back end. The hinges 4a and 4b are fixed or attached to and supported on the first end 2a. The second end 2b is positioned on the opposite side of the first end 2a and is, for example, a front end.

As shown in FIG. 1, the first end 2a includes a recess 16. The recess 16 is recessed toward the input module 15. In other words, the first end 2a includes a pair of protrusions 17a and 17b protruding to the back, on both sides of the recess 16, respectively. The hinges 4a and 4b are attached to the protrusions 17a and 17b, respectively.

The second housing 3 is, for example, a display housing. The second housing 3 accommodates a display 21. The display 21 may also be called a display module or unit. An example of the display 21 is a liquid crystal display device, but the display 21 is not limited to this. The display 21 includes a display screen 21a on which an image and video are displayed. The display 21 is an example of a second module. The module accommodated in the second housing 3 is not limited to the display 21, but may be, for example, an antenna module or other modules.

The second housing 3 includes a front wall 22 (lower wall, first wall), a back wall 23 (rear wall, upper wall, second wall) and a peripheral wall 24 (sidewall, third wall), and is formed as a flat box. The front wall 22 may also be called a lower wall or a first wall. The back wall 23 may also be called a rear wall, an upper wall or a second wall. The peripheral wall 24 may also be called a sidewall or a third wall.

The front wall 22 includes an opening 22a from which the display screen 21a is exposed. The back wall 23 is positioned on the opposite side of the front wall 22 and extends substantially parallel to the front wall 22. The back wall 23 covers the back surface of the display 21. The peripheral wall 24 extends in a direction intersecting the front wall 22 and the back wall 23, for example, in a direction substantially orthogonal to the front wall 22 and the back wall 23, and connects the peripheral edge of the front wall 22 and the peripheral edge of the back wall 23.

The second housing 3 includes a first end 3a and a second end 3b. The first end 3a is, for example, a lower end. The hinges 4a and 4b are fixed or attached to and supported on the first end 3a. The second end 3b is positioned on the opposite side of the first end 3a and is, for example, an upper end.

A hinge cover 25 is attached to the first end 3a of the second housing 3. The hinge cover 25 may be simply called a cover. The hinge cover 25 covers the hinges 4a and 4b. The hinge cover 25 protrudes from the front wall 22 to the front. That is, the hinge cover 25 forms a protrusion protruding in a thickness direction of the second housing 3 on the second housing 3. The protrusion of the hinge cover 25 is positioned in the recess 16 of the first housing 2.

The first end 2a of the first housing 2 and the first end 3a of the second housing 3 are connected to each other by the hinges 4a and 4b so as to be rotatable or openable and closable. Thus, the electronic device 1 can be opened and closed, change the form, or be folded. The electronic device 1 is opened and closed between a first state and a second state.

The first state is a state where the upper wall 12 of the first housing 2 and the front wall 22 of the second housing 3 overlap each other and the electronic device 1 is closed. In the first state, the display screen 21a and the input module 15 are hidden from the outside. In contrast, the second state is a state where the second housing 3 is rotated around the first housing 2 and the electronic device 1 is opened. In the second state, the display screen 21a and the input module 15 are exposed to the outside.

Next, the hinge 4a is described in detail. Since the two hinges 4a and 4b have substantially the same structure, description of the hinge 4b is omitted.

As shown in FIG. 2 and FIG. 3, the hinge 4a of the present embodiment is a hollow hinge through which the cable 27 can be passed. More specifically, the hinge 4a includes a first member 31, a second member 32, a plurality of disc springs 33 and a stopper 34

The first member 31 includes a hollow pipe 35 extending cylindrically and a first fixing portion 36 attached to the outer peripheral surface of the pipe 35. The cable 27 is passed through the pipe 35. The first fixing portion 36 is integrally fixed to the pipe 35. The first fixing portion 36 is fixed to the first housing 2. The first fixing portion 36 includes, for example, a plurality of holes 36a into which screws 40 are inserted (see FIG. 6).

The second member 32 includes a hole corresponding to the outside diameter D1 (see FIG. 5) of the pipe 35 of the first member 31. The pipe 35 of the first member 31 is passed through the hole of the second member 32. The second member 32 can be rotated around the pipe 35 while the pipe 35 of the first member 31 is passed through the hole of the second member 32. The second member 32 includes a second fixing portion 37. The second fixing portion 37 is fixed to the second housing 3. The second fixing portion 37 includes, for example, a plurality of holes 37a into which screws are inserted. The first fixing portion 36 may be fixed to the second housing 3 and the second fixing portion 37 may be fixed to the first housing 2.

As shown in FIG. 2 and FIG. 3, the first member 31 and the second member 32 are in contact with each other. Each of the disc springs 33 includes a hole corresponding to the outside diameter D1 of the pipe 35 of the first member 31. The pipe 35 of the first member 31 is passed through the holes of the disc springs 33. The disc springs 33 press the second member 32 against the first member 31 while the pipe 35 of the first member 31 is passed through the holes of the disc springs 33.

The stopper 34 is positioned on the opposite side of the second member 32 with respect to the disc springs 33. The stopper 34 supports the disc springs 33 such that the disc springs 33 do not come off the pipe 35 in the opposite direction of the second member 32. Such a structure generates frictional force (torque) between the first member 31 and the second member 32. Therefore, the hinge 4a can maintain the position of the second housing 3 while the second housing 3 stands up from the first housing 2.

As shown in FIG. 1, the electronic device 1 includes the cable 27. The cable 27 is, for example, a harness. The cable 27 is passed through the pipe 35 of the hinge 4a to extend inside the first housing 2 and the second housing 3. The cable 27 includes a first end 27a and a second end 27b positioned on the opposite side of the first end 27a.

The first end 27a of the cable 27 is positioned inside the first housing 2. A first connector 38 is attached to the first end 27a of the cable 27. The first connector 38 may also be called a first terminal. The first connector 38 is electrically connected to the first module inside the first housing 2. The first module is, for example, the circuit board 5.

The second end 27b of the cable 27 is positioned inside the second housing 3. A second connector 39 is attached to the second end 27b of the cable 27. The second connector 39 may also be called a second terminal. The second connector 39 is electrically connected to the second module inside the second housing 3. The second module is, for example, the display 21.

Figure 4:
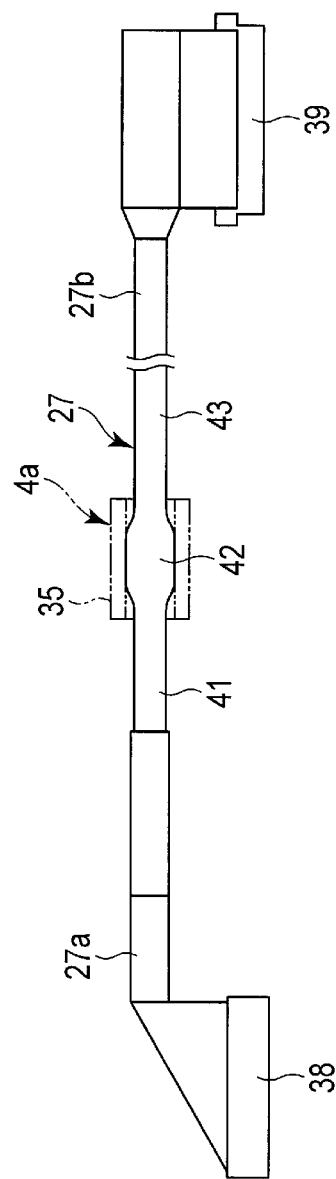
FIG. 4 is a plan view of the cable shown in FIG. 1.

As shown in FIG. 2, FIG. 4 and FIG. 5, the cable 27 includes a first portion 41, a second portion 42 and a third portion 43. The first portion 41 is an example of a thinly-wrapped portion or a small-diameter portion. The first portion 41 is thinner than the inside diameter D2 of the pipe 35 of the hinge 4a and positioned outside the pipe 35. For example, the first portion 41 extends inside the first housing 2. The above-described first connector 38 is attached to the end of the first portion 41. In other words, the first portion 41 extends from the first connector 38 to the second portion 42.

The second portion 42 is an example of a thickly-wrapped portion or a large-diameter portion. The second portion 42 is formed to be thicker than the first portion 41. As shown in FIG. 5, the second portion 42 is positioned inside the pipe 35 and in contact with the inner surface 35a of the pipe 35. The inner surface 35a may also be called the inner peripheral surface of the pipe 35.

For example, the pipe 35 is cylindrical with an inside diameter D2 and outside diameter D1 that are substantially constant. The inner surface 35a of the pipe 35 extends substantially parallel to the cable 27. The second portion 42 has, for example, a thickness corresponding to the inside diameter D2 of the pipe 35 and is in contact with the inner surface 35a of the pipe 35. For example, the second portion 42 has a thickness substantially equal to the inside diameter D2.

The second portion 42 of the cable 27 is in contact with the inner surface 35a of the pipe 35, for example, in a radial direction of the cable 27 or the pipe 35, i.e., in a direction substantially orthogonal to the longitudinal direction of the pipe 35. For example, the second portion 42 of the cable 27 may have elasticity.

The second portion 42 is in contact with the inner surface 35a of the pipe 35, for example, in all region of the inner surface 35a of the pipe 35 in a circumferential direction, i.e., in a 360-degree region. The second portion 42 may be in contact with the inner surface 35a of the pipe 35 only in a plurality of predetermined positions. For example, the inner surface 35a of the pipe 35 includes a first inner surface portion 35aa and a second inner surface portion 35ab positioned on the opposite side of the first inner surface portion 35aa. For example, the second portion 42 may be only in contact with the first inner surface portion 35aa and the second inner surface portion 35ab. The second portion 42 may be in contact with the inner surface 35a of the pipe 35 only in three or more predetermined positions.

As shown in FIG. 2, FIG. 4 and FIG. 5, the third portion 43 is another example of a thinly-wrapped portion or a small-diameter portion. The third portion 43 is thinner than the inside diameter D2 of the pipe 35 and positioned outside the pipe 35. For example, the third portion 43 has a thickness substantially equal to the thickness of the first portion 41. For example, the third portion 43 extends inside the second housing 3.

The above-described second connector 39 is attached to the end of the third portion 43. In other words, the third portion 43 extends from the second connector 39 to the second portion 42. That is, the second portion 42 is positioned between the first portion 41 and the third portion 43 and formed to be thicker than the first portion 41 and the third portion 43.

A first direction X and a second direction Y are defined as follows. The first direction X is a direction in which the cable 27 or the pipe 35 extends and is, for example, a direction from the second portion 42 to the first portion 41. The second direction Y is the opposite direction of the first direction X. That is, the second direction Y is a direction in which the cable 27 or the pipe 35 extends and is, for example, a direction from the second portion 42 to the third portion 43.

As shown in FIG. 5, frictional force acts between the second portion 42 of the cable 27 and the inner surface 35a of the pipe 35, which prevents the second portion 42 of the cable 27 from coming out of the pipe 35. For example, the frictional force acts between the second portion 42 of the cable 27 and the inner surface 35a of the pipe 35 when the cable 27 is pulled in the first direction X. The frictional force also acts between the second portion 42 of the cable 27 and the inner surface 35a of the pipe 35 when the cable 27 is pulled in the second direction Y. Therefore, the second portion 42 of the cable 27 is semifixed inside the pipe 35 of the hinge 4a.

Next, an example of a structure of the cable 27 is described.

As shown in FIG. 5, the cable 27 includes a plurality of electric wires 51, a supporting member 52 and a cover 53. The electric wires 51 extend over the first to third portions 41, 42 and 43 of the cable 27. That is, the electric wires 51 extend from the first connector 38 to the second connector 39 and electrically connect the first connector 38 and the second connector 39.

The supporting member 52 is provided in the second portion 42 of the cable 27. The supporting member 52 may also be called a spacer. The supporting member 52 is attached to the outer peripheral surface of the electric wires 51. For example, the supporting member 52 is formed of a few layers of tape wrapped around the outer peripheral surface of the electric wires 51. An example of the tape is an acetate tape, but the tape is not limited to this. The outside diameter D3 of the supporting member 52 is thus larger than the thickness D4 of a bundle of the electric wires 51.

As shown in FIG. 5, the cover 53 is positioned, for example, in the outermost periphery of the cable 27, and constitutes the outer peripheral surface of the cable 27. The cover 53 may also be called an outer sheath, a shield, a conductive portion, a conductive member, a ground portion or a tube. The cover 53 is provided over the first to third portions 41, 42 and 43 of the cable 27, and covers the electric wires 51 and the supporting member 52.

The cover 53 is attached to the outer peripheral surface of the electric wires 51 and the outer peripheral surface of the supporting member 52, and covers the complete periphery of the electric wires 51 and the complete periphery of the supporting member 52. The cover 53 is, for example, a conductive fabric and shields the electric wires 51.

For example, the hinge 4a is formed of metal. The inner surface 35a of the pipe 35 of the hinge 4a is conductive. For example, the inner surface 35a of the pipe 35 is electrically connected to the ground of the first housing 2. Instead, the hinge 4a may have the conductive inner surface 35a by, for example, forming the hinge 4a of another material such as synthetic resin and applying conductive coating or plating to the inner surface 35a of the pipe 35.

In the present embodiment, the conductive cover 53 is positioned on the outermost periphery of the cable 27 and in contact with the inner surface 35a of the pipe 35 of the hinge 4a in the second portion 42. The cover 53 is thus electrically connected to the ground via the inner surface 35a of the pipe 35 of the hinge 4a. The cover 53 thereby has a shielding effect to suppress the release of noise from the electric wires 51.

The cover 53 is not limited to the conductive member, but may be, for example, a nonconductive member. That is, the cover 53 is not necessarily required to have the shielding effect. As a nonconductive member, for example, an insulating member or an acetate tape can be used.

As shown in FIG. 5, the cover 53 covers a region larger than the length L of the supporting member 52 and wider than the supporting member 52. More specifically, the cover 53 extends over the outer peripheral surface of the supporting member 52 and the outer peripheral surface of the electric wires 51 of the first portion 41. A comparatively smooth first slope 61 is thereby formed between the first portion 41 and the second portion 42 of the cable 27. The first slope 61 has an outside diameter diminishing from the supporting member 52 toward the first portion 41. The first slope 61 thus makes a step between the first portion 41 and the second portion 42 smooth.

Similarly, the cover 53 extends over the outer peripheral surface of the supporting member 52 and the outer peripheral surface of the electric wires 51 of the first portion 43. A comparatively smooth second slope 62 is thereby formed between the third portion 43 and the second portion 42 of the cable 27. The second slope 62 has an outside diameter diminishing from the supporting member 52 toward the third portion 43. The first slope 61 thus makes a level difference between the third portion 43 and the second portion 42 smooth.

In the present embodiment, an acetate tape serving as the supporting member 52 is wrapped around the outer peripheral surface of the electric wires 51 while leaving an interval to the inside diameter D2 of the pipe 35 of the hinge 4a corresponding to one or two layers of tape. A conductive fabric exemplarily serving as the cover 53 is wrapped around the outer peripheral surface of the supporting member 52 to cover the supporting member 52 and the electric wires 51. As shown in FIG. 2 and FIG. 3, the conductive fabric is wrapped around the electric wires 51, for example, in a spiral manner.

As shown in FIG. 2, a mark 64 used for position adjustment is provided on the outer peripheral surface of the cable 27. The mark 64 is, for example, a line drawn in a circumferential direction of the cable 27. As shown in FIG. 3, the mark 64 is provided at a position which is substantially adjusted to the end of the pipe 35 while the second portion 42 of the cable 27 is positioned inside the pipe 35 of the hinge 4a. The second portion 42 of the cable 27 can be thereby adjusted to a predetermined position in the pipe 35 of the hinge 4a by substantially adjusting the mark 64 to the end of the pipe 35 at the time of assembly of the electronic device 1.

Figure 6:
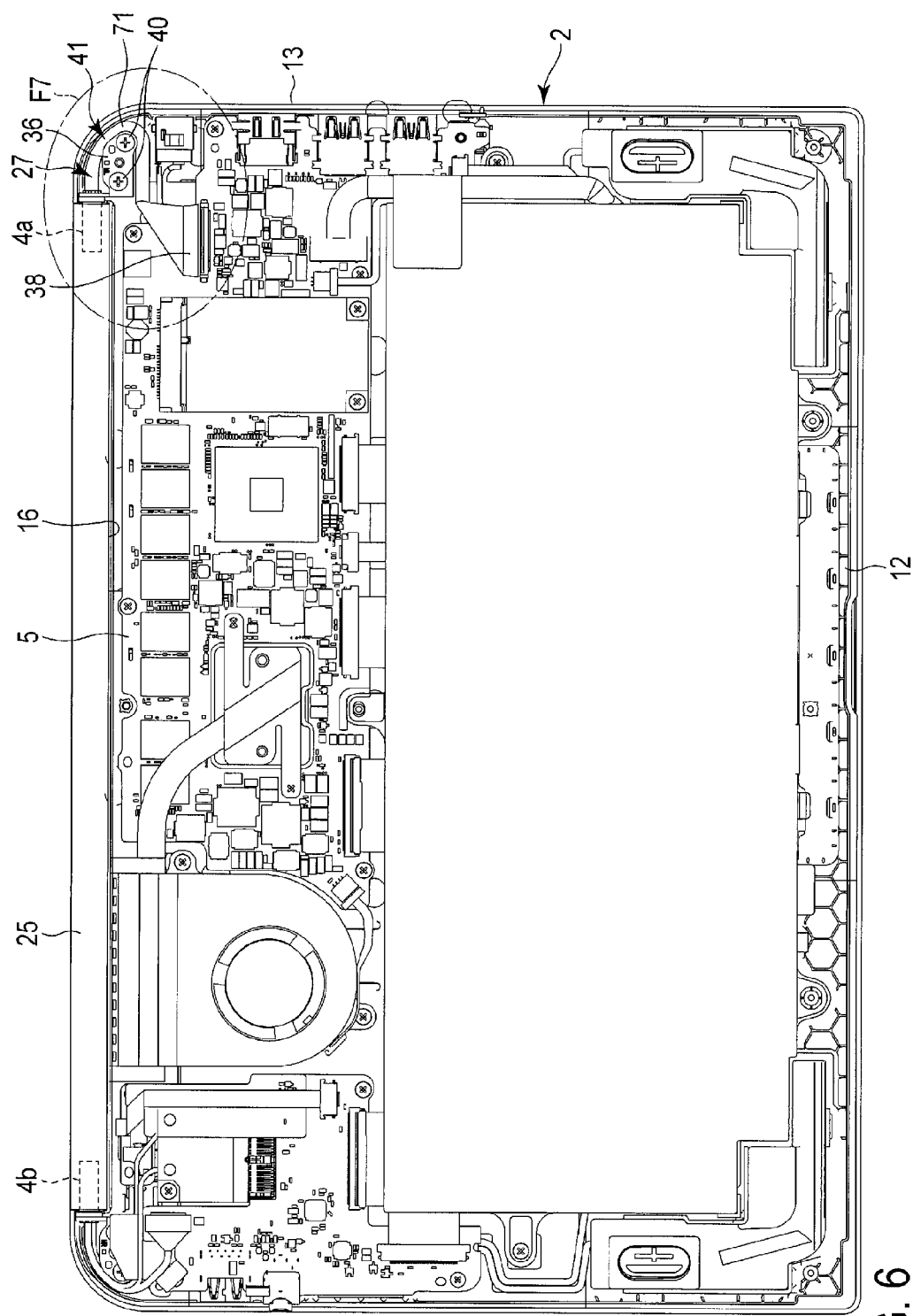
FIG. 6 is a bottom view of an interior of a housing of the electronic device shown in FIG. 1.

FIG. 6 is an illustration showing the inside of the first housing 2 seen from the lower side. For example, the first housing 2 is formed of metal. The inner surface 66 of the first housing 2, for example, the inner surface of the peripheral wall 13 is conductive. The conductive inner surface 66 of the first housing 2 constitutes at least a part of the ground of the electronic device 1. Instead, the first housing 2 may have the conductive inner surface 66 by, for example, forming the first housing 2 of another material such as synthetic resin and applying conductive coating or plating to the inner surface 66 of the first housing 2.

As shown in FIG. 7, the first portion 41 of the cable 27 extends inside the first housing 2 from the hinge 4a, curved to the opposite side and connected to the circuit board 5. That is, the first portion 41 of the cable 27 includes a curved portion 71 between the hinge 4a and the first connector 38. The curved portion 71 may also be called a bent portion.

More specifically, the first portion 41 of the cable 27 enters into the first housing 2 from the hinge 4a and extends along the peripheral wall 13 of the first housing 2. A part of the curved portion 71 is positioned along the peripheral wall 13 and in contact with the peripheral wall 13.

The first housing 2 includes a supporting portion 72 in contact with the curved portion 71 of the cable 27 from the opposite side of the peripheral wall 13. An example of the supporting portion 72 is a boss to which the first fixing portion 36 of the hinge 4a is attached. The curved portion 71 of the cable 27 is passed between the supporting portion 72 and the peripheral wall 13. In other words, the curved portion 71 of the cable 27 is curved around the supporting portion 72. An interval between the supporting portion 72 and the peripheral wall 13 has a width corresponding to the thickness of the first portion 41 of the cable 27, for example, a width substantially equal to the thickness of the first portion 41. Therefore, the curved portion 71 of the cable 27 is sandwiched and semifixed between the supporting portion 72 and the peripheral wall 13.

Since the second portion 42 of the cable 27 is supported by the pipe 35 of the hinge 4a, the first connector 38 and the second portion of the cable 27 prevent the first portion 41 of the cable 27 from being misaligned. That is, the first connector 38 and the second portion 42 of the cable 27 serve as supporting portions that reliably press the first portion 41 of the cable 27 against the inner surface of the peripheral wall 13 of the first housing 2. The first portion 41 of the cable 27 is thereby electrically connected to the ground via the first housing 2. As shown in FIG. 2, a part of the first portion 41 of the cable 27 may be formed to be thick by wrapping a number of layers of the conductive cover 53.

According to such a structure, the ease of assembly of the electronic device 1 can be improved.

For comparison, a case where the thickness of the cable 27 is less than the inside diameter D2 of the pipe 35 of the hinge 4a over the entire length of the cable 27 is considered. For example, the cable 27 is often carried in a state of being preliminarily combined with the hinge 4a, as it is called a hinge ASSY or a hinge assembly. In this case, if the thickness of the cable 27 is less than the inside diameter D2 of the pipe 35 of the hinge 4a, the hinge 4a may come loose with respect to the cable 27 and, for example, be extremely misaligned from a predetermined position.

In contrast, the electronic device 1 of the present embodiment includes the hinge 4a connecting the first housing 2 and the second housing 3 and including the pipe 35, and the cable 27. The cable 27 includes a first portion 41 positioned outside the pipe 35 and a second portion 42 formed to be thicker than the first portion 41, positioned inside the pipe 35 and in contact with the inner surface 35a of the pipe 35.

Such a structure prevents the hinge 4a from being easily misaligned with respect to the cable 27. Therefore, the necessity to readjust the positions of the cable 27 and the hinge 4a can be reduced at the time of assembly of the electronic device 1. The ease of assembly of the electronic device 1 can be thereby improved. Furthermore, in the present embodiment, the cable 27 is not thick over the entire length but, for example, the first portion 41 is thinner than the inside diameter D2 of the pipe 35 of the hinge 4a. Therefore, the cable 27 can be easily passed through the pipe 35 of the hinge 4a.

In the present embodiment, the frictional force acts between the second portion 42 of the cable 27 and the inner surface 35a of the pipe 35, which prevents the second portion 42 of the cable 27 from coming out of the pipe 35. The hinge 4a is thereby further prevented from being easily misaligned with respect to the cable 27. Therefore, the ease of assembly of the electronic device 1 can be further improved.

In the present embodiment, the cable 27 includes the electric wires 51 and the conductive cover 53 covering the electric wires 51. The cover 53 is in contact with the inner surface 35a of the pipe 35 in the second portion 42 and electrically connected to the ground via the hinge 4a.

According to such a structure, the conductive cover 53 can be reliably electrically connected to the ground. Therefore, the strength of grounding of the cover 53 can be increased or the ground structure of the cover 53 can be stabilized, and the shielding effect of the cover 53 can be improved. The noise from the cable 27 can be thereby reduced.

As shown in FIG. 1, for example, an antenna 74 is present near the cable 27 in the present embodiment. In such a case, reduction of noise from the cable 27 can contribute to the improvement of antenna performance.

In the present embodiment, the cable 27 includes the supporting member 52 attached to the outer peripheral surface of the electric wires 51 in the second portion 42. The cover 53 extends over the outer peripheral surface of the supporting member 52 and the outer peripheral surface of the wires 51 in the first portion 41 and forms a slope between the first portion 41 and the second portion 42.

Such a structure makes the sharp step between the first portion 41 and the second portion 42 smooth. Therefore, when the second portion 42 is inserted into the pipe 35 of the hinge 4a, the step between the first portion 41 and the second portion 42 hardly lodges in the pipe 35. Thus, the second portion 42 can be easily inserted into the pipe 35 of the hinge 4a. This contributes to the improvement of the ease of assembly of the electronic device 1.

In the present embodiment, the supporting member 52 is formed of a tape wrapped around the outer peripheral surface of the electric wires 51. According to such a structure, the supporting member 52 attached to the outer peripheral surface of the electric wires 51 can be implemented by a comparatively-simple structure.

In the present embodiment, the mark 64 is provided on the outer peripheral surface of the cable 27. The mark 64 is substantially adjusted to the end of the pipe 35 while the second portion 42 is positioned inside the pipe 35. According to such a structure, the position adjustment of the pipe 35 of the hinge 4a and the second portion 42 of the cable 27 can be easily carried out by using the mark 64 as a guide. This contributes to the improvement of the ease of assembly of the electronic device 1.

In the present embodiment, the cable 27 includes the connector 38 electrically connected to the module inside the first housing 2. The first housing 2 includes the conductive inner surface. The first portion 41 is positioned between the connector 38 and the second portion 42, in connection with the inner surface 66 of the first housing 2 and electrically connected to the ground via the first housing 2.

According to such a structure, the strength of grounding of the cover 53 can be increased and the shielding effect of the cover 53 can be improved. The noise around the cable 27 can be thereby reduced.

Second Embodiment

Next, an electronic device 1 of a second embodiment is described with reference to FIG. 8. Constituent elements having functions like or similar to the constituent elements of the first embodiment are represented by the same reference numbers and their descriptions are omitted. Constituent elements other than those hereinafter described are the same as the first embodiment.

In the present embodiment, the supporting member 52 is attached to the outer peripheral surface of the cover 53. The second portion 42 of the cable 27 is formed to be thicker than the first portion 41 and the third portion 43 by providing the supporting member 52. The supporting member 52 and the cover 53 are conductive and electrically connected to the ground via the hinge 4a.

According to such a structure, too, the hinge 4a is prevented from being easily misaligned with respect to the cable 27 similarly to the first embodiment. The ease of assembly of the electronic device 1 can be thereby improved.

Embodiments are not limited to the above-described embodiments, but can be materialized by variously modifying the constituent elements without departing from the spirit of the invention. In addition, various embodiments can be formed by an arbitrary combination of the plurality of constituent elements disclosed in the above-described embodiments. For example, some of the constituent elements disclosed in the embodiments may be deleted. Further, the constituent elements of different embodiments may be arbitrarily combined.

For example, the supporting member 52 is not limited to the tape wrapped around the electric wires 51 but may be, for example, rubber, a sponge or other members attached to the electric wires 51. The mark 64 is not limited to a mark drawn along the circumferential direction of the cable 27, but may be various marks that can be used for position adjustment.

What is claimed is:

1. An electronic device comprising:
   a first housing;
   a second housing;
   a hinge configured to connect the first housing and the second housing and comprising a pipe having a substantially constant inside diameter; and
   a cable comprising a first portion outside the pipe and a second portion inside the pipe, the second portion being thicker than the first portion and in contact with an inner surface of the pipe, wherein
   the inner surface of the pipe is electrically conductive and is connected to ground,
   the cable comprises a plurality of electric wires and an electrically conductive cover provided across the first portion and the second portion and covering the electric wires, and
   the cover shields the electric wires, is in contact with the inner surface of the pipe in the second portion, and is electrically connected to round via the hinge.

2. The electronic device of claim 1, wherein
   a frictional force which prevents the second portion from coming out of the pipe acts between the second portion of the cable and the inner surface of the pipe.

3. The electronic device of claim 1, wherein
   the cable comprises a supporting member attached to an outer peripheral surface of the electric wires in the second portion, and
   the cover extends over an outer peripheral surface of the supporting member and the outer peripheral surface of the electric wires in the first portion and forms a slope between the first portion and the second portion.

4. The electronic device of Claim 1, further comprising a module in the first housing, wherein
   the cable comprises a connector electrically connected to the module inside the first housing,
   the first housing comprises a conductive inner surface, and
   the first portion is positioned between the connector and the second portion, in contact with the inner surface of the first housing and electrically connected to ground via the first housing.

5. The electronic device of claim 4, wherein
   a frictional force which prevents the second portion of the cable from coming out of the pipe acts between the second portion of the cable and the inner surface of the pipe, and
   the first portion is pressed against the inner surface of the first housing in a state where the first portion is prevented from being misaligned by the second portion and the connector.

6. The electronic device of claim 1, wherein
a mark is provided on an outer peripheral surface of the cable, and
the mark is substantially adjusted to an end of the pipe while the second portion is positioned inside the pipe.

7. The electronic device of claim 1, wherein
the cable comprises a plurality of electric wires, a supporting member attached to an outer peripheral surface of the electric wires in the second portion, and a cover covering the electric wires and the supporting member, and
the cover extends over an outer peripheral surface of the supporting member and the outer peripheral surface of the electric wires in the first portion and forms a slope between the first portion and the second portion.

8. The electronic device of claim 1, wherein
the cover is a conductive fabric spirally wrapped around the cable.

9. An electronic device comprising:
a first housing, the first housing being electrically conductive;
a second housing;
a hinge configured to connect the first housing and the second housing and comprising a pipe; and
a cable comprising a first portion outside the pipe, a second portion inside the pipe, and a connector fixed inside the first housing, the second portion being thicker than the first portion and in contact with an inner surface of the pipe, wherein
the cable comprises a plurality of electric wires, and an electrically conductive cover provided at least in the first portion and covering the electric wires,
a friction force which prevents the second portion of the cable from coming out of the pipe acts between the second portion of the cable and the inner surface of the pipe, and
the first portion is positioned between the second portion and the connector, is pressed against the inner surface of the first housing in a state where the first portion is prevented from being misaligned by the second portion and the connector, and is electrically connected to ground.

10. The electronic device of claim 9, wherein
the first portion comprises a curved portion bent in an opposite direction between the hinge and the connector, and
the curved portion is pressed against the inner surface of the first housing and is electrically connected to ground via the first housing.

* * * * *